(12) United States Patent
Metzler

(10) Patent No.: US 6,420,757 B1
(45) Date of Patent: Jul. 16, 2002

(54) SEMICONDUCTOR DIODES HAVING LOW FORWARD CONDUCTION VOLTAGE DROP, LOW REVERSE CURRENT LEAKAGE, AND HIGH AVALANCHE ENERGY CAPABILITY

(75) Inventor: Richard Metzler, Mission Viejo, CA (US)

(73) Assignee: VRAM Technologies, LLC, Costa Mesa, CA (US)

( * ) Notice: Subject to any disclaimer, the term of this patent is extended or adjusted under 35 U.S.C. 154(b) by 0 days.

(21) Appl. No.: 09/395,719

(22) Filed: Sep. 14, 1999

(51) Int. Cl.⁷ .......................... H01L 29/76; H01L 29/94
(52) U.S. Cl. .................... 257/341; 257/401; 257/601
(58) Field of Search ...................... 257/46, 104, 106, 257/109, 112, 121, 175, 212, 288, 341, 401, 601, 653

(56) References Cited

U.S. PATENT DOCUMENTS

| | | | |
|---|---|---|---|
| 2,444,255 A | 6/1948 | Hewlett | 175/366 |
| 3,295,030 A | 12/1966 | Allison | 317/235 |
| 3,407,343 A | 10/1968 | Fang | |
| 3,427,708 A | 2/1969 | Schutze, et al. | 29/580 |
| 3,458,798 A | 7/1969 | Fang | |
| 3,566,215 A | 2/1971 | Heywang | 317/235 |
| 3,586,925 A | 6/1971 | Collard | |
| 3,617,824 A | 11/1971 | Shinoda et al. | |
| 3,619,737 A | 11/1971 | Chiu | 317/235 |

(List continued on next page.)

FOREIGN PATENT DOCUMENTS

| | | |
|---|---|---|
| DE | 3219-888 A | 5/1982 |
| DE | 19305633 A | 2/1996 |
| JP | 361156882 A * | 7/1986 |
| JP | 63205927 A | 8/1988 |
| JP | 63054762 | 9/1988 |
| JP | 405109883 A | 4/1993 |
| WO | WO98/33218 | 7/1998 |

OTHER PUBLICATIONS

United States Statutory Invention Registration, Reg. No. H64, Published May 6, 1986, Full–Wave Rectifier for CMOS IC CHIP, Inventor: Maleis.

Breakdown Voltage Enhancement of the p–n Junction by Self–Aligned Double Diffusion Process Through a Tapered SiO2 Implant Mask; Han–Soo Kim, Seong–Dong Kim, Min–Koo Han, Seok–Nam Yoon and Yearn–Ik Choi; Sep. 16, 1995 IEEE Electron Device Letters; pp. 405–407.

Silicon Processing for the VLSI Era, vol. 1, Processing Technology; Stanley Wolf and Richard N. Tauber; 1986; pp. 321–327.

Primary Examiner—Olik Chaudhuri
Assistant Examiner—Hoai Pham
(74) Attorney, Agent, or Firm—Blakely, Sokoloff, Taylor & Zafman LLP

(57) ABSTRACT

Semiconductor diodes are diode connected cylindrical field effect transistors having one diode terminal as the common connection between the gate and the drain of the cylindrical field effect transistors. The method of processing the field effect transistor provides very short channels, shallow diffused regions and trench terminated junctions at the edges of the active device. The trench terminated junctions are formed out of a vertical etch cut through the P-N junction at the edge of the device forming the trench which is then passivated with a dielectric material to provide a region of higher breakdown voltage at the edge of the device than is seen within the active device area. The trench terminated junction results in spreading the breakdown energy over the entire active device region rather than just device edges. The preferred fabrication technique for the active device uses two masks and two masking steps, without any critical mask alignment requirements.

40 Claims, 8 Drawing Sheets

U.S. PATENT DOCUMENTS

| | | | |
|---|---|---|---|
| 3,749,987 A | 7/1973 | Anantha | |
| 3,769,109 A | 10/1973 | MacRae, et al. | 156/3 |
| 3,864,819 A | 2/1975 | Ying | 29/583 |
| 3,935,586 A | 1/1976 | Landheer et al. | |
| 3,943,547 A | 3/1976 | Nagano et al. | 357/38 |
| 3,988,765 A | 10/1976 | Pikor | 357/52 |
| 4,019,248 A | 4/1977 | Black | 29/583 |
| 4,045,250 A | 8/1977 | Dingwall | 148/1.5 |
| 4,099,260 A | 7/1978 | Lynes et al. | |
| 4,104,086 A | 8/1978 | Bondur et al. | 148/1.5 |
| 4,138,280 A | 2/1979 | Rodov | 148/186 |
| 4,139,880 A | 2/1979 | Ulmer et al. | |
| 4,139,935 A | 2/1979 | Bertin et al. | |
| 4,140,560 A | 2/1979 | Rodov | 148/188 |
| 4,153,904 A | 5/1979 | Tasch, Jr. et al. | 357/13 |
| 4,246,502 A | 1/1981 | Kubinec | |
| 4,318,751 A | 3/1982 | Horng | 148/1.5 |
| 4,330,384 A | 5/1982 | Okudaira et al. | 204/192 |
| 4,340,900 A | 7/1982 | Goronkin | 357/56 |
| 4,372,034 A | 2/1983 | Bohr | 29/577 |
| 4,423,456 A | 12/1983 | Zaidenweber | |
| 4,533,988 A | 8/1985 | Daly et al. | |
| 4,534,826 A | 8/1985 | Goth et al. | 156/643 |
| 4,586,075 A | 4/1986 | Schwenk et al. | 357/74 |
| 4,579,626 A | 8/1986 | Wallace | 156/651 |
| 4,638,551 A | 1/1987 | Einthoven | 29/571 |
| 4,666,556 A | 5/1987 | Fulton et al. | 156/643 |
| 4,672,736 A | 6/1987 | Westermeier | 29/569 |
| 4,672,738 A | 6/1987 | Stengl et al. | 29/576 |
| 4,680,601 A | 7/1987 | Mitlehner et al. | |
| 4,739,386 A | 4/1988 | Tanizawa | 357/34 |
| 4,742,377 A | 5/1988 | Einthoven | 357/15 |
| 4,745,395 A | 5/1988 | Robinson | |
| 4,757,031 A | 7/1988 | Kuhnert et al. | 437/154 |
| 4,774,560 A | 9/1988 | Coe | 357/52 |
| 4,777,580 A | 10/1988 | Bingham | |
| 4,808,542 A | 2/1989 | Reichert et al. | 437/20 |
| 4,811,065 A | 3/1989 | Cogan | |
| 4,822,601 A | 4/1989 | Goode et al. | 424/59 |
| 4,822,757 A | 4/1989 | Sadamori | 437/249 |
| 4,857,985 A | 8/1989 | Miller | |
| 4,875,151 A | 10/1989 | Ellsworth et al. | |
| 4,900,692 A | 2/1990 | Robinson | 437/67 |
| 4,903,189 A | 2/1990 | Ngo et al. | |
| 4,927,772 A | 5/1990 | Arthur et al. | 437/6 |
| 4,974,050 A | 11/1990 | Fuchs | 357/50 |
| 5,038,266 A | 8/1991 | Callen et al. | |
| 5,047,355 A | 9/1991 | Huber et al. | |
| 5,093,693 A | 3/1992 | Abbas et al. | 357/13 |
| 5,101,254 A | 3/1992 | Hamana | |
| 5,109,256 A | 4/1992 | De Long | |
| 5,132,749 A | 7/1992 | Nishibayashi et al. | |
| 5,144,547 A | 9/1992 | Masamoto | |
| 5,184,198 A | 2/1993 | Bartur | |
| 5,225,376 A | 7/1993 | Feaver et al. | 437/228 |
| 5,258,640 A | 11/1993 | Hsieh et al. | |
| 5,268,833 A | 12/1993 | Axer | |
| 5,296,406 A | 3/1994 | Readdie et al. | |
| 5,349,230 A | 9/1994 | Shigekane | |
| 5,365,102 A | 11/1994 | Mehrotra et al. | |
| 5,396,087 A * | 3/1995 | Baliga | 257/139 |
| 5,426,325 A | 6/1995 | Chang et al. | 257/408 |
| 5,430,323 A | 7/1995 | Yamazaki et al. | |
| 5,469,102 A | 11/1995 | Shigekane | 327/478 |
| 5,469,103 A | 11/1995 | Shigekane | 327/478 |
| 5,475,245 A | 12/1995 | Kudo et al. | 257/288 |
| 5,475,252 A * | 12/1995 | Merrill et al. | 257/341 |
| 5,506,421 A | 4/1996 | Palmour | 257/77 |
| 5,510,641 A | 4/1996 | Yee et al. | |
| 5,536,676 A | 7/1996 | Cheng et al. | 437/162 |
| 5,780,324 A | 7/1998 | Tokura et al. | |
| 5,818,084 A | 10/1998 | Williams et al. | |
| 5,825,079 A | 10/1998 | Metzler et al. | |
| 5,886,383 A * | 3/1999 | Kinzer | 257/341 |
| 5,907,181 A | 5/1999 | Han et al. | 257/630 |
| 6,002,574 A | 12/1999 | Metzler et al. | 361/301.4 |
| 6,186,408 B1 | 2/2001 | Rodov et al. | 238/268 |

\* cited by examiner

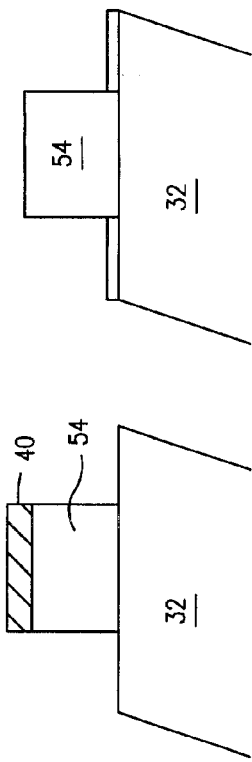
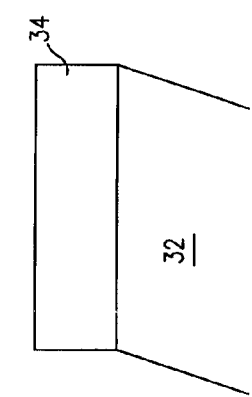
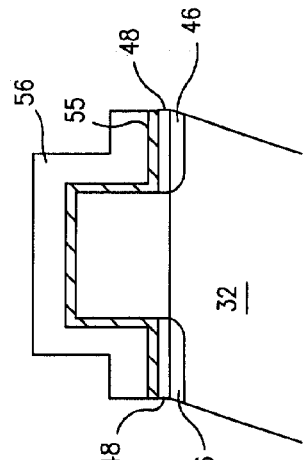
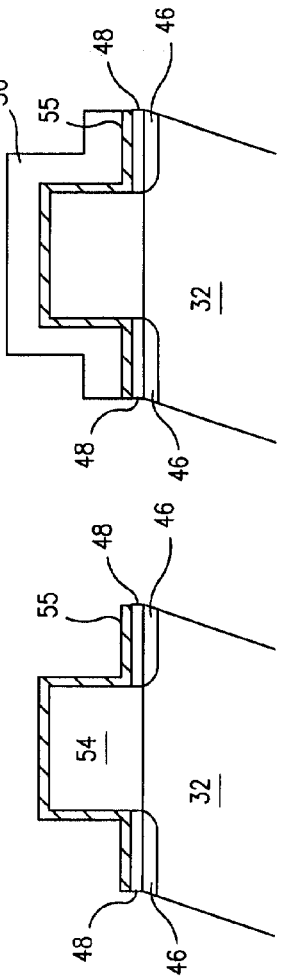
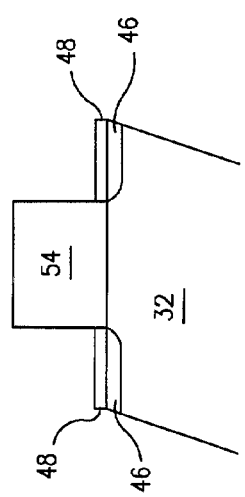
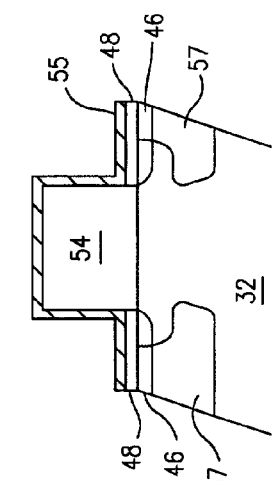
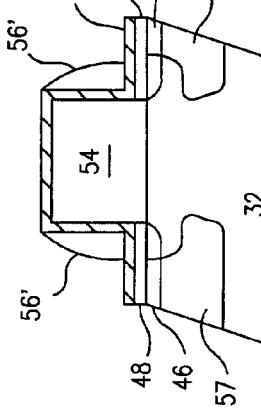
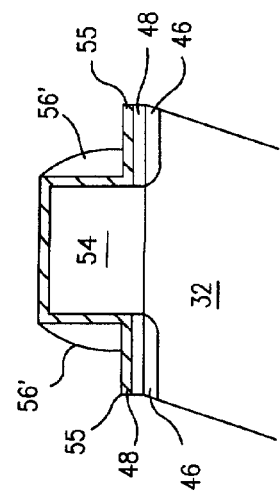

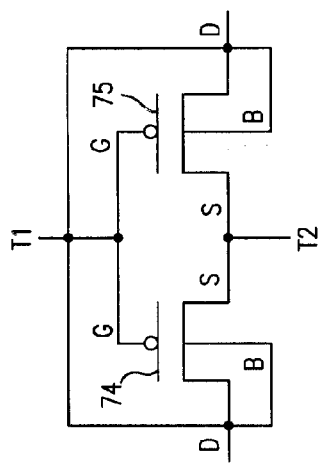
FIG. 4A
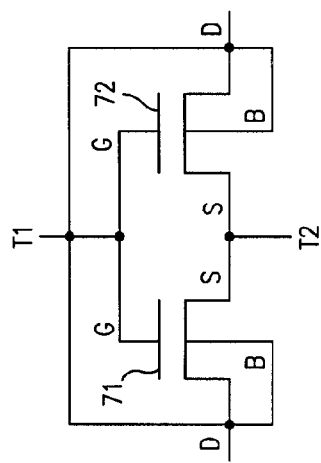
FIG. 4D
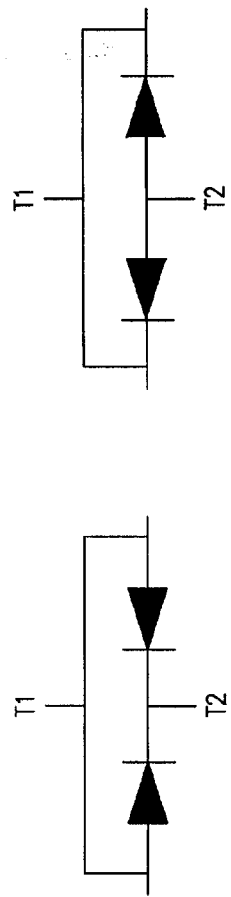
FIG. 4B
FIG. 4E
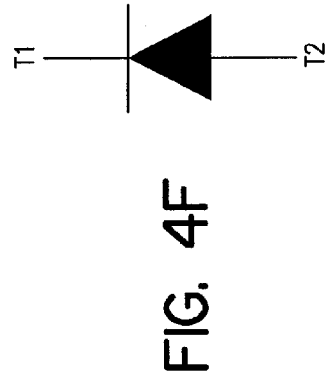
FIG. 4C
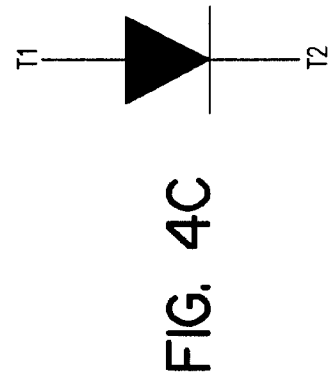
FIG. 4F
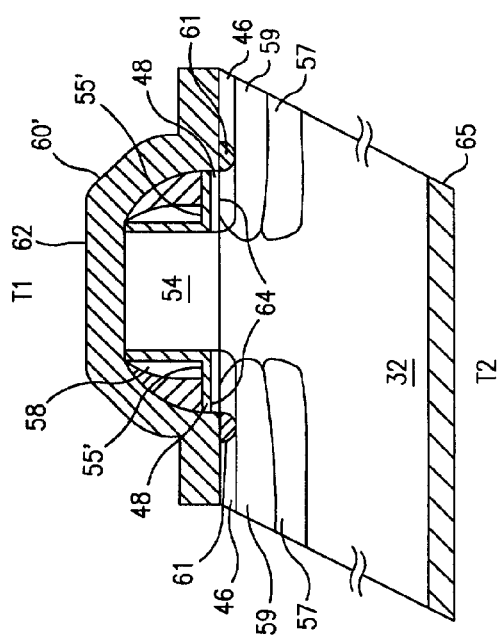
FIG. 3Q

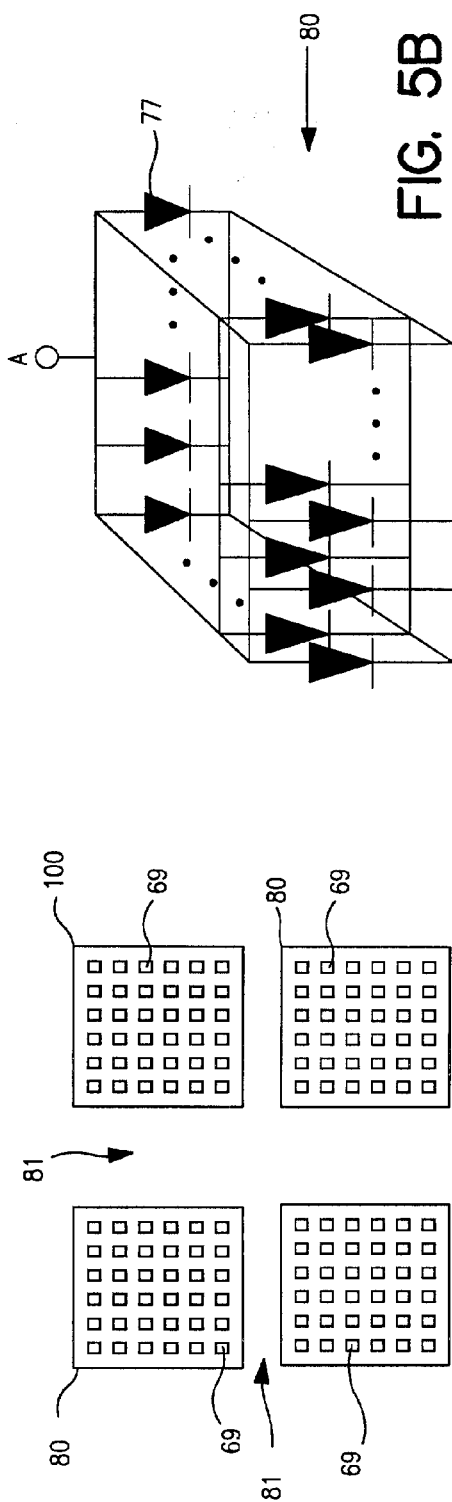
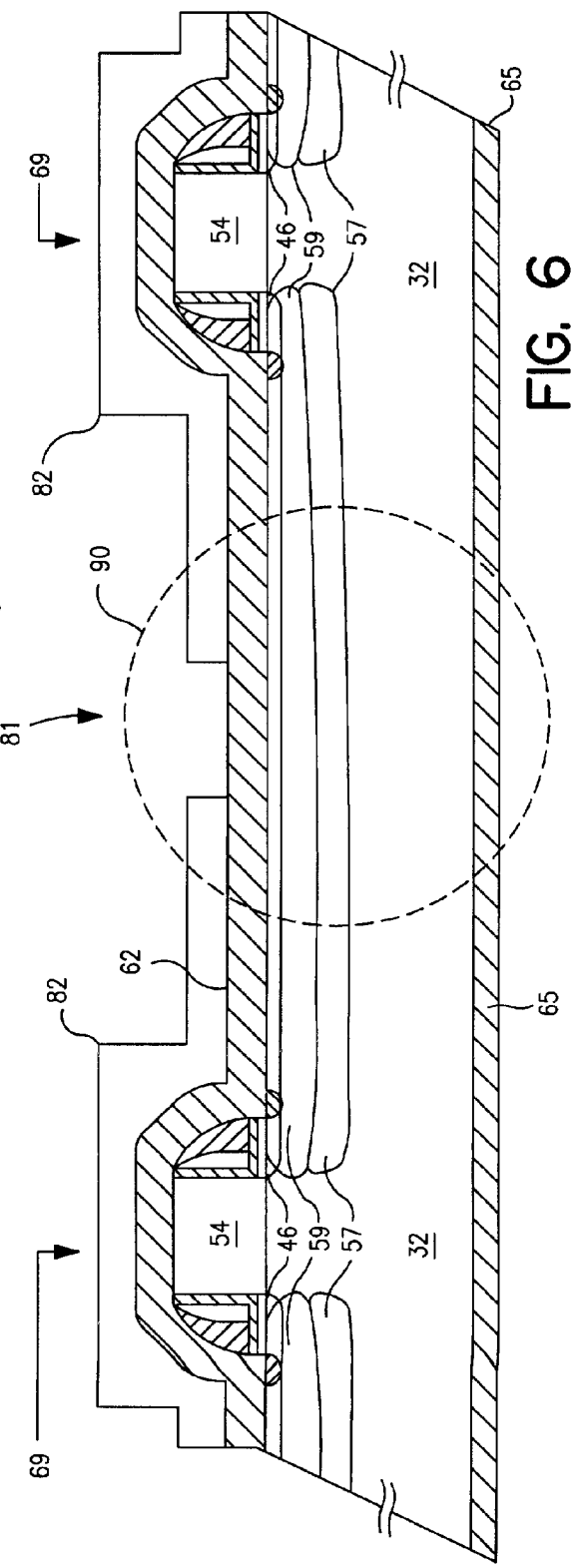
FIG. 5A
FIG. 5B
FIG. 6

SEMICONDUCTOR DIODES HAVING LOW FORWARD CONDUCTION VOLTAGE DROP, LOW REVERSE CURRENT LEAKAGE, AND HIGH AVALANCHE ENERGY CAPABILITY

BACKGROUND OF THE INVENTION

1. Field of the Invention

The present invention generally relates to the field of semiconductor devices and methods of fabricating the same. The present invention particularly relates to semiconductor diodes and their methods of fabrication.

2. Prior Art

Semiconductor devices of various kinds are well known in the prior art. The present invention relates to methods of fabricating semiconductor diodes and the diodes so fabricated, though the methods are also directly applicable to the fabrication of transistors as well. Because of the emphasis on diodes herein, only the prior art relating thereto will be discussed.

Semiconductor diodes are widely used in electronic circuits for various purposes. The primary purpose of such semiconductor diodes is to provide conduction of current in a forward direction in response to a forward voltage bias, and to block conduction of current in the reverse direction in response to a reverse voltage bias. This rectifying function is widely used in such circuits as power supplies of various kinds as well as in many other electronic circuits.

In typical semiconductor diodes, conduction in the forward direction is limited to leakage current values until the forward voltage bias reaches a characteristic value for the particular type of semiconductor device. By way of example, silicon pn junction diodes don't conduct significantly until the forward bias voltage is at least approximately 0.7 volts. Many silicon Schottky diodes, because of the characteristics of the Schottky barrier, can begin to conduct at lower voltages, such as 0.4 volts. Germanium pn junction diodes have a forward conduction voltage drop of approximately 0.3 volts at room temperature. However, the same are currently only rarely used, not only because of their incompatibility with silicon integrated circuit fabrication, but also even as a discrete device because of temperature sensitivity and other undesirable characteristics thereof.

In some applications, diodes are used not for their rectifying characteristics, but rather to be always forward biased so as to provide their characteristic forward conduction voltage drop. For instance, in integrated circuits, diodes or diode connected transistors are frequently used to provide a forward conduction voltage drop substantially equal to the base-emitter voltage of another transistor in the circuit. While certain embodiments of the present invention may find use in circuits of this general kind, such use is not a primary objective thereof.

In circuits which utilize the true rectifying characteristics of semiconductor diodes, the forward conduction voltage drop of the diode is usually a substantial disadvantage. By way of specific example, in a DC to DC step-down converter, a transformer is typically used wherein a semiconductor switch controlled by an appropriate controller is used to periodically connect and disconnect the primary of the transformer with a DC power source. The secondary voltage is connected to a converter output, either through a diode for its rectifying characteristics, or through another semiconductor switch. The controller varies either the duty cycle or the frequency of the primary connection to the power source as required to maintain the desired output voltage. If a semiconductor switch is used to connect the secondary to the output, the operation of this second switch is also controlled by the controller.

Use of a semiconductor switch to couple the secondary to the output has the advantage of a very low forward conduction voltage drop, though has the disadvantage of requiring careful control throughout the operating temperature range of the converter to maintain the efficiency of the energy transfer from primary to secondary. The use of a semiconductor diode for this purpose has the advantage of eliminating the need for control of a secondary switch, but has the disadvantage of imposing the forward conduction voltage drop of the semiconductor diode on the secondary circuit. This has at least two very substantial disadvantages. First, the forward conduction voltage drop of the semiconductor diode device can substantially reduce the efficiency of the converter. For instance, newer integrated circuits commonly used in computer systems are designed to operate using lower power supply voltages, such as 3.3 volts, 3 volts and 2.7 volts. In the case of a 3 volt power supply, the imposition of a 0.7 volt series voltage drop means that the converter is in effect operating into a 3.7 volt load, thereby limiting the efficiency of the converter to 81%, even before other circuit losses are considered.

Second, the efficiency loss described above represents a power loss in the diode, resulting in the heating thereof. This limits the power conversion capability of an integrated circuit converter, and in many applications requires the use of a discrete diode of adequate size, increasing the overall circuit size and cost.

Another commonly used circuit for AC to DC conversion is the full wave bridge rectifier usually coupled to the secondary winding of a transformer having the primary thereof driven by the AC power source. Here two diode voltage drops are imposed on the peak DC output, making the circuit particularly inefficient using conventional diodes, and increasing the heat generation of the circuit requiring dissipation through large discrete devices, heat dissipating structures, etc. depending on the DC power to be provided.

Therefore, it would be highly advantageous to have a semiconductor diode having a low forward conduction voltage drop for use as a rectifying element in circuits wherein the diode will be subjected to both forward and reverse bias voltages from time to time. While such a diode may find many applications in discreet form, it would be further desirable for such a diode to be compatible with integrated circuit fabrication techniques so that the same could be realized in integrated circuit form as part of a much larger integrated circuit. Further, while reverse current leakage is always undesirable and normally must be made up by additional forward conduction current, thereby decreasing circuit efficiency, reverse current leakage can have other and more substantial deleterious affects on some circuits. Accordingly it would also be desirable for such a semiconductor diode to further have a low reverse bias leakage current.

In many applications it is required that the diode be put across a coil such as a transformer. In these instances it is possible for a reverse voltage to be applied to the diode which will force it into reverse breakdown, specifically into a junction avalanche condition. This is particularly true in DC to DC converters which use a rapidly changing waveform to drive transformer coils which are connected across diode bridges. In these applications a specification requirement for "Avalanche Energy" capability is a parameter normally included in the data sheets. The avalanche energy capability of a diode is a significant factor for a designer of such circuits. The avalanche energy capability determines how much design margin a designer has when designing a semiconductor diode into a circuit. The larger the number of avalanche energy capability the more design flexibility a circuit designer has.

The avalanche energy capability is a measure of the diode's capability to absorb the energy from the coil, where energy $E=(\frac{1}{2})*I^2*L$, without destroying the diode. These requirements are typically on the order of tens of millijoules. A key factor in the ability of a diode to nondestructively dissipate this energy is the amount of junction area which dissipates the energy i.e., the area of the junction which actually conducts during avalanche. It is desirable to increase the avalanche energy capability of a semiconductor diode to improve its utilization.

BRIEF SUMMARY OF THE INVENTION

The present invention includes methods and apparatus as described in the claims. Briefly, semiconductor diodes having a low forward conduction voltage drop, a low reverse leakage current, a high voltage capability and enhanced avalanche energy capability, suitable for use in integrated circuits as well as for discrete devices are disclosed. The semiconductor diodes are diode connected cylindrical field effect transistors having one diode terminal as the common connection between the gate and the drain of the cylindrical field effect transistors. The method of processing the field effect transistor provides very short channels, shallow diffused regions and trench terminated junctions at the edges of the active device. The trench terminated junctions are formed out of a vertical etch cut through the P-N junction at the edge of the device forming the trench which is then passivated with a dielectric material to provide a region of higher breakdown voltage at the edge of the device than is seen within the active device area. The trench terminated junction results in spreading the breakdown energy over the entire active device region rather than just device edges. The preferred fabrication technique for the active device uses two masks and two masking steps, without any critical mask alignment requirements. Various embodiments are disclosed.

BRIEF DESCRIPTION OF THE FIGURES

FIGS. 4A–4B illustrate schematic equivalent circuits for a two dimensional model of an N-channel pedestal diode.

FIG. 4C illustrates the schematic equivalent circuit for a three dimensional model of the N-channel pedestal diode.

FIGS. 4D–4E illustrate schematic equivalent circuits for a two dimensional model of an P-channel pedestal diode.

FIG. 4F illustrates the schematic equivalent circuit for a three dimensional model of the P-channel pedestal diode.

FIG. 5A illustrates activediode areas on a wafer employing a plurality of pedestal diodes.

FIG. 5B is a schematic diagram of the electrical equivalent of one active diode area.

FIG. 6 is a cross-sectional view of the first steps in the formation of trenches in the preferred embodiment of the present invention.

Like reference numbers and designations in the drawings indicate like elements providing similar functionality.

DETAILED DESCRIPTION OF THE PRESENT INVENTION

Figure 1:
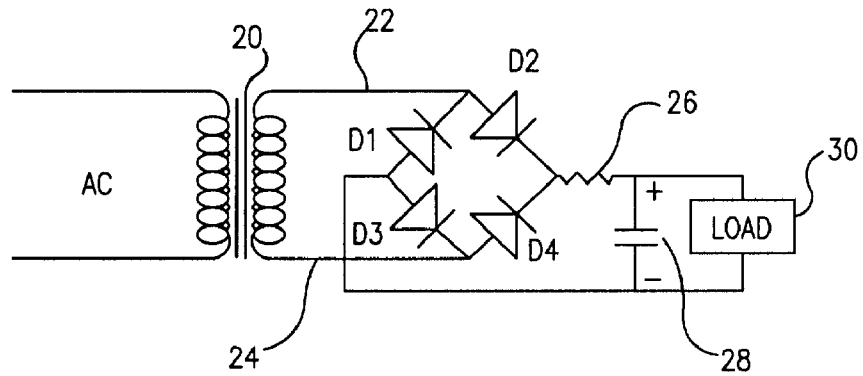
FIG. 1 is a circuit diagram for a well known AC to DC converter using a full wave bridge rectifier in which the present invention may be used.

First referring to FIG. 1, a circuit diagram for a well known AC to DC converter using a full wave bridge rectifier in which the present invention may be used may be seen. In such circuits, a transformer 20 is used to provide DC isolation between the primary and secondary circuits and frequently to provide an AC voltage step-up or step-down to the full wave bridge, comprised of diodes D1, D2, D3 and D4. When the secondary lead 22 is sufficiently positive with respect to secondary lead 24, diode D2 will conduct through resister 26 to charge or further charge capacitor 28 and to provide current to load 30, which current returns to lead 24 of the transformer through diode D3. Similarly, during the other half cycle of the AC input voltage, when the voltage on secondary lead 24 is sufficiently positive with respect to secondary lead 22, diode D4 will conduct to provide current through resistor 26 to charge capacitor 28 and to provide current to load 30, with the capacitor and load currents being returned to the secondary lead 22 through diode D1. Thus it may be seen that each time current is delivered from the full wave bridge of diodes D1 through D4 to the output of the bridge, two diode voltage drops are imposed in series with that output. Further, since any pair of diodes conduct only when the voltage across the secondary of the transformer 20 exceeds the voltage across capacitor 28 by two diode voltage drops, it is clear that current is delivered to the output of the bridge only during a fraction of the time, namely when the transformer secondary voltage is at or near a positive or negative peak.

The circuit of FIG. 1 is merely exemplary of the type of circuit in which the present invention is intended to be used. These circuits may be characterized as circuits wherein the diode will be subjected to both positive (forward) and negative (reverse) differential voltages across the two diode connections and the function of the diode is a rectifying function to provide a DC or rectified current output. This is to be distinguished from applications wherein the desired function of a diode is to provide a voltage reference responsive to the forward conduction voltage drop characteristic of the diode when conducting current, whether or not the diode will be subjected to negative differential voltages also when in use. These circuits may also be characterized as circuits wherein the diode or diodes will be subjected to both positive and negative differential voltages across the diode connections and the function of the diode or diodes is a power rectifying function to provide a DC or rectified current output of sufficient power level to power one or more circuits connected thereto. This is to be distinguished from applications wherein the desired function of the diode is to provide a signal-level current output which is used or processed in a subsequent circuit not powered by the DC or rectified current output of the diodes.

Figure 2A:
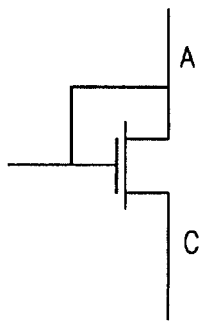
FIGS. 2A–2B are schematic diagrams of n-channel and p-channel field effect devices diode connected in accordance with the present invention.
Figure 2B:
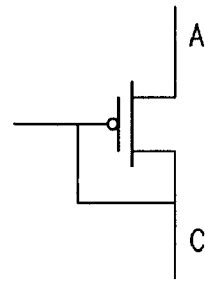
Figure 2C:
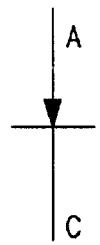
FIG. 2C is a schematic diagram of the equivalent circuit of the diode connected field effect devices of FIGS. 2A and 2B.

In many circuits of the type shown in FIG. 1, a linear voltage regulator may be used in the output in addition to smoothing capacitor 28. Further, resistor 26, which serves as a current limiting resistor, may be eliminated as a separate circuit component in favor of the secondary resistance of the transformer, as the transformer, in substantially all applications of interest, will be an actual discrete component of sufficient size to dissipate the power loss therein. Of particular importance to the present invention, however, are the diodes D1 through D4 themselves, as the power loss in these diodes in general serves no desired circuit function, but rather merely creates unwanted power dissipation and heat, requiring the use of larger diodes, whether in discrete form or integrated circuit form, and actually increases the size of the transformer required to provide this extra power output, e.g., the power required by the load plus the power dissipated by the diodes. The present invention is directed to the realization of diodes and/or diode functions having low diode forward conduction voltage drops, low reverse current leakage, and high voltage capabilities for use primarily in such circuits and other circuits wherein the diodes are in fact subjected to forward and reverse bias in use. This is achieved in the present invention through the use of diode connected field effect devices, shown schematically in FIGS. 2A and 2B as n-channel and p-channel diode connected field effect devices, respectively. In accordance with the preferred embodiment of the invention, such devices are fabricated through the use of common gate and drain connections, typically a common conducting layer on the substrate, and more preferably through one or more special fabrication techniques which enhance the electrical characteristic of the resulting device. FIG. 2C illustrates the equivalent diode of the diode connected field effect devices of FIGS. 2A and 2B with the respective anode "A" and cathode "C" terminals.

Figure 3K:
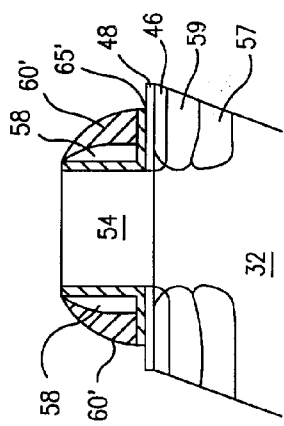
FIGS. 3A–3Q are cross-sectional views illustrating steps in an exemplary process for fabricating the pedestal diode of a preferred embodiment of the present invention.
Figure 3L:
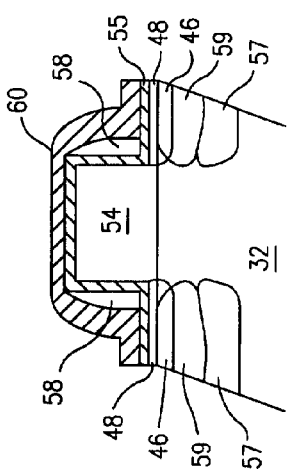
Figure 3M:
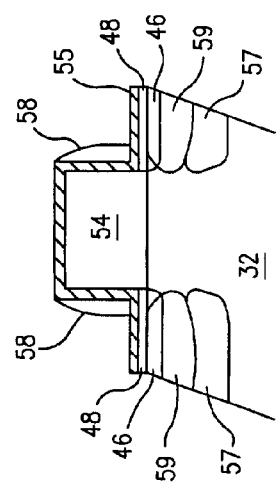
Figure 3N:
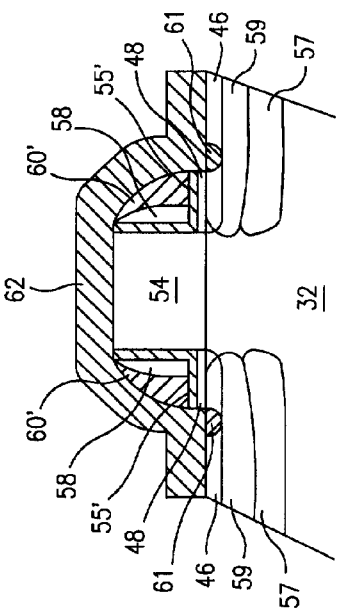
Figure 3O:
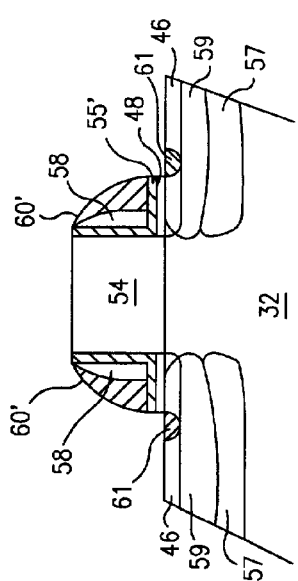
Figure 3P:
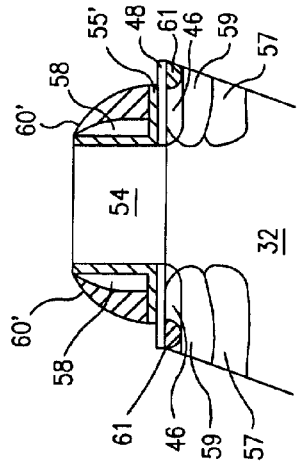

A process for fabricating a preferred embodiment of the present invention is presented herein in relation to the cross-sectional views of FIGS. 3A through 3P. FIG. 3A illustrates a silicon substrate 32 for a single diode. However, the silicon substrate 32, in FIG. 3A and in some of the subsequent figures is a chip sized substrate for multiple diodes and obviously represents numerous such chips fabricated on a single silicon wafer, as is well known in the technology. In the specific embodiment described, the substrate is an n-type substrate.

The first step is to deposit a layer of pedestal material 34 such as a thick oxide layer as shown in FIG. 3B. This is typically one micron thick, although the thickness will be adjusted to compensate for subsequent processing requirements. A layer of photoresist 40 is deposited and patterned by photolithography using a first mask layer. The layer of pedestal material 34 is etched using the patterned photoresist 40 as an etch mask to form a plurality of oxide pedestals, generally indicated by the reference numeral 54 in FIG. 3C. These pedestals 54 may be any convenient cylindrical shape, such as, by way of example, circular, hexagonal, rectangular or square. In that regard, in the embodiment described herein, the pedestals 54 are approximately 1 micron square and arranged in a two dimensional array, whereby a typical circuit may have on the order of 1.2 million such pedestals. An alternate embodiment, however, may use rectangular pedestals of say approximately 1 micron wide, but having a length of many microns, so that the number of pedestals across one dimension of the circuit are far fewer (as few as one) than the number of pedestals across a second dimension of the circuit. In any event, the pedestals 54 are formed by putting down a layer of photoresist, patterning the same, and then plasma etching, so that the pedestals will have substantially straight (vertical) sidewalls, as opposed to somewhat tapered sidewalls typically provided by wet etching.

Alternatively, the pedestals 54 described as being formed of an oxide may be fabricated of other materials, such as by way of example, depositing an oxide, nitride, oxide sandwich of layers rather than a single oxide layer. The pedestals 54 may be entirely nonconductive, or alternatively, may be formed of a conductive layer such as polysilicon. If formed of a conductive layer the pedestal should be insulated from the substrate thereunder. For instance, an equivalent pedestal structure may be fabricated by first forming one or more layers of the pedestal on the substrate, at least the first of which is a dielectric (electric insulator) such as an oxide or a nitride, and then etching the layer or layers as described to form the substantially vertical walled pedestals, exposing the substrate between pedestals.

In any case, after forming the cylindrical pedestals 54, a thin oxide layer 48, approximately 100 Angstroms in thickness, is then grown in the region between pedestals 54 on the substrate 32 as shown in FIG. 3D. Then as shown in FIG. 3E, an optional channel implant layer 46 may be implanted through the oxide layer 48. The pedestals 54 acting to shield the substrate 32, terminates the channel implant layer 46 adjacent to the edge of the pedestals 54. Preferably arsenic atoms are implanted as the channel implant layer approximately 200 Angstroms deep in the substrate. Boron atoms may alternatively be used for the channel implant layer. The channel implant layer 46 provides threshold adjustment for the diode device.

Then, as shown in FIG. 3F, a thin conductive layer of material 55, such as n-type doped polysilicon approximately 500 Angstroms thick, is isotropically deposited. Because layer 55 is an isotropic deposited layer, it will have approximately the same build-up on all surfaces, whether or not the surface is horizontal or vertical. Layer 55 determines the work function for the field effect gate of the diode and is referred to as a polysilicon gate layer.

The next step, shown in FIG. 3G is to isotropically deposit a "construction" layer 56, which will subsequently be removed. The material of layer 56 coats the vertical and horizontal surfaces essentially equally as before. The material of layer 56 may be any type of material which can be etched independently of the other materials on the device, such as an oxide, and is approximately 5500 Angstroms thick. In a subsequent plasma etch, however, layer 56 is removed substantially equally, but only in the vertical direction. Thus, a subsequent plasma etch of approximately 5500 Angstroms will remove the layer 56 from the horizontal surfaces but leaves layer 56 on regions 56', referred to as masking rings, on the surrounding sides or outer cylindrical surface of the pedestals, each approximately 5500 Angstroms thick, as may be seen in FIG. 3H. The masking rings have an inner cylindrical surface coupling to the conductive layer or polysilicon gate layer 55. The exterior surface is a cylindrical surface of varying radius from top to bottom varying the overall thickness of the masking rings. If a circular cylinder, the masking rings appear like an upside down bowl with a hole in the bottom and having a larger thickness at the edge of the bowl. This step of forming the masking rings 56', additionally defines a pattern of openings down to the polysilicon layer 55 which is used to create implant regions for the p-type backgate implant.

The next step is to implant through the oxide layer 48 and polysilicon 55 layer with a p-type dopant in the case of p-type diffusion. This is typically done in two steps, one higher energy implant of boron at 150 KeV, and a lower energy implant of BF2 at 70 KeV. The two step implant provides a good surface contact region and a deep lateral scattering of boron under the "channel" region to provide for adequate breakdown voltage depletion. FIG. 3I illustrates the pedestal 54 and the implanted diffusion region 57 after the implantation. Next the masking rings 56' and any other remnants of the construction layer 56 are removed as illustrated in FIG. 3J.

After removal of the first construction layer 56, a second construction layer of material, typically an oxide, is isotropically deposited of approximately 1500 Angstroms thick. The second construction layer is then vertically etched by a plasma etch step which etches approximately 1500 Angstroms of material from the construction layer. This isotropic deposition and plasma etch form a spacer ring 58 of approximately 1500 Angstroms thick on the sidewalls of the pedestals 54. The spacer ring 58 is illustrated in FIG. 3K. The spacer rings 58 have an inner cylindrical surface coupling to the conductive layer or polysilicon gate layer 55. The exterior surface is a cylindrical surface of varying radius from top to bottom varying the overall thickness of the spacing rings. If a circular cylinder, the spacing rings 58 appear like an upside down bowl with a hole in the bottom and having a larger thickness at the edge of the bowl.

The next step, also illustrated in FIG. 3K, is to perform an additional implantation to form diffusion regions 59. The diffusion regions 59 are formed to be a p+ type by implanting boron or similar ion through the thin oxide layer 48 and the polysilicon layer 55, deep enough in the silicon substrate 32 to act as a backgate for the field effect device (diode connected). The upper tail of the implant also serves as a threshold adjustment for the device. This results in a p-type implant concentration near the surface of the silicon of about $10^{16}$ atoms/cm$^2$.

The next step, shown in FIG. 3L, is to isotropically deposit a second polysilicon layer 60 approximately 3000 Angstroms thick over the pedestal structure 54, including the oxide spacer 58. The next step is to then perform a vertical etch using plasma etch techniques to leave polysilicon sidewalls (gate rings 60') surrounding the pedestal structure 54 as illustrated by FIG. 3M. This vertical etch forms what is referred to as gate rings 60' on the spacer rings 58. The gate rings 60' have an inner surface shaped like the outer surface of the spacer rings 58, if present. The gate rings 60' outer surface is shaped similar to its inner surface but space apart by a varying thickness and radius from top to bottom as illustrated in FIG. 3M. The gate rings 60' are otherwise hollow and cylindrical in shape centered around the center axis of the pedestals 54. The vertical etch of layer 60 also removes the exposed polysilicon of layer 55 which extends beyond the deposited sidewall gate rings 60' and the portion on top of the pedestals 54 thereby forming gate layer 55'. If shorter channel lengths are desired for the diode connected transistor, the construction spacer 58 may be removed before the deposition of the second polysilicon layer 60. If so, the inner surface of the gate rings 60' is similar to the previously described inner surface of the space rings 58.

With reference to FIG. 3N, the next step is to complete the formation of one active diode region, the drain diffusion 61 of the cylindrical diode. In the case of N-channel MOSFET cylindrical diodes, the drain diffusion 61 is formed by implanting an n-type dopant through the exposed oxide 48 into the p-type implant 59 within the silicon substrate. This n-type implantation is kept near the surface and has a doping level, which is not sufficient to invert the first P-type implant 57, but of sufficient doping level to invert the backgate implant 59 and form n-type diffusion regions 61 therein. FIG. 3N illustrates the completion of this implantation step which forms the diffusion regions 61. The next step is to remove the exposed oxide 48 to allow contact to the silicon surface, in preparation for the interconnect layer deposition. FIG. 3O illustrates the completion of the removal of the exposed oxide 48. In the next step of the process, one or more interconnect layers (referred to as interconnect layer 62) are deposited over the diode pedestal circuit as illustrated in FIG. 3P. The interconnect layer 62 makes electrical contact with the n-type channel implant layer 46 and diffusion regions 61 and the p+-type diffusion regions 57 & 59. The interconnect layer 62 may be a single conductive layer or a plurality of conductive layers such as polysilicon, a silicide and/or metal layers. The interconnect layer 62 forms a first terminal, "T1", of the resulting diode, interconnecting the polysilicon gate regions 55' & 60' with the channel implant layer 46, diffusion region 61 and the diffusion regions 57 & 59.

A second terminal, "T2", of the diode pedestal is formed by applying a conductive layer 65 to the backside of the substrate 32. FIG. 3Q illustrates a two dimensional cross section of a completed diode pedestal circuit 69. The diode pedestal circuit 69 is actually a three dimensional diode having a cylindrical shape. In the case of a circular cylindrical diode, if the two dimensional cross section of FIG. 3Q is rotated about the center of the pedestal the three dimensional pedestal results. Otherwise the pedestal diode may be formed of nearly any cylindrical shape including square, rectangular, or elliptical.

As illustrated in FIG. 3Q, the diode pedestal circuit 69 is a cylindrical MOS transistor which is diode connected. The cylindrical MOS transistor has a drain region which is the diffusion 61, the channel region 64 which is a portion of the diffusion 59 between the substrate 32 and the diffusion 61 under the gate, a source region which is a portion of the substrate 32 near the channel, and a body which is the diffusion 59 and 57. The active diode regions are the first diode regions 63 which is part of the substrate 32 and the second diode regions formed by the diffusion 61 between which current will flow. Very short channel regions 64 of the cylindrical transistor of the pedestal are defined primarily by the polysilicon region 60 during fabrication. The short channel region 64 for the transistor is the portion of the diffusion 59 which is under and overlaps with the oxide 48 and the polysilicon gate 55' and gate rings 60' and which is between the substrate 32 and the diffusion 61. The short channel region 64 typically has a channel length of approximately three tenths of a micron in the preferred embodiment but may be altered accordingly to a different dimension.

As a result of the MOS transistor being cylindrical, a number of its regions or components have various shapes. The original pedestal was formed by the layer 54 which has a solid cylindrical shape. The oxide 48 has a hollow cylindrical shape with inner and outer cylindrical surfaces such that it has a thickness. The inner side cylindrical surface of the oxides surrounds the outer cylindrical surface of layer 54. If the cylinder is a circle, the oxide 48 is shaped like a washer. The polysilicon gate 55' conforms to the cylindrical shape of the sidewalls of the pedestal layer 54 and rests on top of the hollow cylindrical shape of the oxide 48.

The diffusions 57 and 59 are likewise implanted in a hollow cylindrical fashion forming diffusion regions that surround the layer 54 pedestal. As a result, the channel at the surface of the substrate is a hollow cylinder in shape with the thickness of the cylinder being the channel length. The diffusion 61 is also implanted in a hollow cylindrical fashion forming a diffusion region that surrounds the channel which is a hollow cylinder in shape at the surface of a thickness. The oxide layer 58 forms spacer rings 58 has a hollow cylindrical shape of varying radius from top to bottom with the thickness of the cylinder varying from top to bottom. The spacer rings 58 may be described as a hollow cylindrical bowl with a hole in the bottom of the bowl. The polysilicon gate layer 60 forms gate rings 60' which is shaped similar to the spacer rings 58 having a hollow cylindrical bowl shape with a hole in the bottom of the bowl. The top edge of the bowl, the lips, of the spacer rings 58 and gate rings 60' each rest on the top surface of the hollow cylindrical oxide 48. The conductive layer 62 surrounds the pedestal covering the gate rings 60' of the polysilicon gate layer 60 on its outer cylindrical surface, and couples electrically thereto. The conductive layer 62 further surrounds the outer cylinder of the hollow cylindrical oxide 48 and electrically couples to the cylindrical shaped surfaces of the diffusions 59 and 61 and the optional channel implant layer 46. The conductive layer 65 has the shape of a conductive sheet coupled to the base of the substrate 32. The conductive layer 65 and substrate 32 may be diced into various shapes.

The process steps in FIGS. 3A–3Q are described as where diffusion 61 is n+ type diffusion, substrate 32 is an n-type of substrate, and diffusion 57 and 59 are p-type diffusion regions. In this case, FIG. 4A illustrates the equivalent circuit of the two dimensional cross section of the diode pedestal circuit 69. In FIG. 4A, the transistors 71 and 72, representing one cylindrical transistor, are n channel MOS transistors and the first terminal, T1, is the anode and the second terminal, T2, is the cathode. FIG. 4B illustrates the diode equivalent of the two dimensional circuit of FIG. 4A where two diodes are connected in parallel together. FIG. 4C illustrates the electrical equivalent, a single diode, of the three dimensional diode pedestal circuit 69 in this case.

While the process steps in FIG.'s 3–3Q are described as diffusion 61 being an n+ type diffusion, substrate 32 being an n-type of substrate, and diffusion 57 and 59 being p-type diffusion regions, they may be altered by using different starting materials and different implant or dopant materials. In this case the diffusion types are reversed from n to p and from p to n in the process steps previously described. FIG. 4D illustrates the equivalent circuit of the two dimensional cross section of the diode pedestal circuit 69 illustrated in FIG. 3Q with reversed type of silicon diffusion and materials. In this case, diffusion 61 is p+ type diffusion, substrate 32 is an p-type of substrate, and diffusion 57 and 59 are n-type diffusion regions. In FIG. 4D, the transistors 74 and 75, representing one cylindrical transistor, are p channel MOS transistors and the first terminal, T1, is the cathode and the second terminal, T2, is the anode. FIG. 4E illustrates the diode equivalent of the two dimensional circuit of FIG. 4D where two diodes are connected in parallel together. FIG. 4F illustrates the electrical equivalent, a single diode, of the three dimensional diode pedestal circuit 69 in this case.

With respect to the current capability of the pedestal diode 69, the maximum forward current is a function of the width of the diode. The shape of the pedestal diode 69 is cylindrical providing a cylindrical width. The cylindrical shape and width of the pedestal diode tends to maximize the width of the diode per unit of diode area. Thus, the pedestal diode 69 is more efficient in providing a given current density per unit of area of device and is therefore less expensive to manufacture.

With respect to the threshold voltage, by appropriately selecting the dopants, their concentrations, and other materials and dimensions for fabrication of the pedestal diode 69, the channel regions may be made to be just conduct at substantially zero forward bias across the anode and cathode. Simulations indicate that forward biasing of the pedestal device by two tenths of a volt should provide a forward current of at least two orders of magnitude greater than the reverse bias leakage current. Simulations also indicate that a forward bias on the order of three tenths of a volt should provide a forward current flow of at least three orders of magnitude greater than the reverse bias leakage current. Thus, in true rectifying applications such as in power supplies and the like, the present invention results in reduced power consumption and heating in the rectifying devices, and greater overall efficiency of the resulting circuits.

With respect to the reverse bias breakdown voltage of the pedestal diode 69, a reverse bias voltage appears between the diffusion 57 and the substrate 32 causing a depletion region to form deep in the substrate. As a result of the diffusion regions 57, 59 and the diode FET connection of the pedestal diode, high reverse bias voltages are kept in the diffusion regions 57, 59 and the substrate layers such that the gate regions 64 of the pedestal diode 69 does not see a high reverse bias voltage. The electric field lines of the reverse bias voltage are additionally substantially planar around the pedestal diode due to the longitudinal shape and grading of the diffusion regions 57 and 59 further increasing the breakdown of the pedestal diode 69. The cylindrical region of the substrate 32 between the cylindrical diffusion regions 57 and 59 totally depletes forming a rather smooth continuous depletion edge below the diffusion regions 57 and 59. To increase the reverse bias breakdown voltage, it is desirable to keep the electric field lines straight and parallel with little crowding at pn junctions and having a minimal amount of curvature near electric field termination points such as at device termination.

Regardless of whether the silicon is p or n-type, the next steps in the process further increase the reverse bias breakdown voltage capability and form the high current capability for the diode structure by arranging for it to be formed out of multiple diode pedestals 69 connected in parallel together and providing device termination through trench isolation. The process begins with the deposition of a masking layer, such as an oxide layer, over the entire wafer. The oxide layer is then masked with photoresist and patterned. Referring now to FIG. 5A, the pattern of photoresist leaves a continuous pad of oxide over a plurality of diode active areas 80 and exposes oxide to define scribe channels 81 between the diode active areas 80 on the wafer. In each diode active area 80 are a plurality of diode pedestals 69. FIG. 5B illustrates the schematic equivalent of a diode active area 80 having multiple diodes 77, each representing a diode pedestal 69, connected in parallel together. Adding the widths of each of these diode pedestals 69 connected in parallel together results in large current carrying capability. It is understood that there are several hundred diode active areas 80 on a wafer, with only four being shown in FIG. 5A. Each individual diode active area 80 contains thousands of individual diode pedestals 69.

Figure 7A:
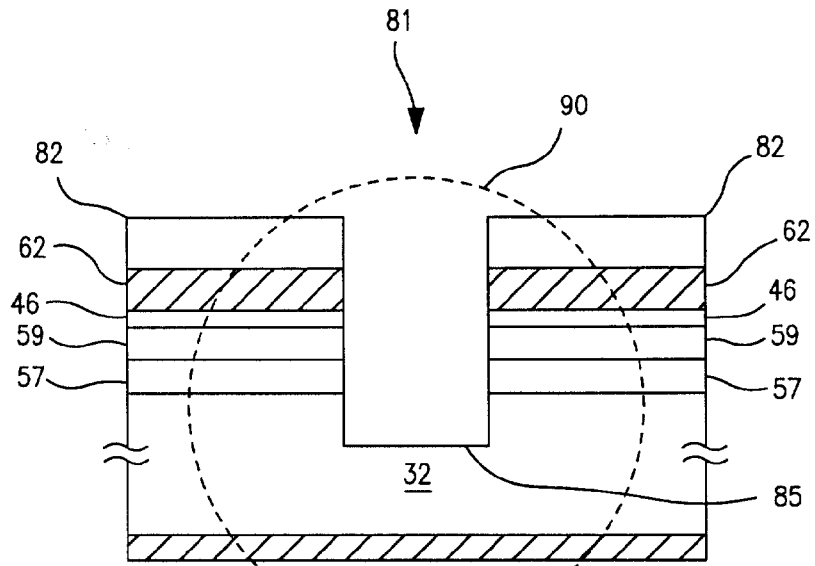
FIGS. 7A–7B are magnified cross-sectional views illustrating the final steps in the formation of the trenches in the preferred embodiment of the present invention.

After forming the pattern of photoresist defining the diode active areas 80 and the scribe channels 81, the oxide layer is then etched to expose the underlying metal layer 52 in the scribe channels 81. FIG. 6 illustrates the oxide layer 82 etched away at scribe channel 81 exposing the underlying metal layer 52. Next, the exposed metal of the metal layer 52 is subsequently etched exposing the underlying silicon surface in the scribe channels 81. The subsequent metal etch of metal layer 52 may be done by using either wet or dry etch techniques. A vertical silicon etch is then used to cut a trench 85 in the underlying silicon in the scribe channels 81 between each of the diode active areas 80. FIG. 7A illustrates the completion of the silicon etch forming the trench 85. The etch forms two vertical trench walls and a bottom of the trench. The width of the trench may be narrow or wide on the order between eight-tenths of a micron to a couple of mils. A narrow trench provides closely spaced devices with similar voltage breakdown levels while a wide trench relaxes the etching step requirements to facilitate ease of manufacturing.

During the silicon etch process the oxide layer 82 protects the metal surfaces from being etched. Trenches 85 have substantially vertical sidewalls 83 as shown if FIG. 7A. The depth of the trench 85 varies depending upon the required operating voltage of the resulting diode. The trench depth is sufficient to extend through both diffusion regions 57 & 59 and into the silicon to a depth which will exceed the expected depletion width during reverse diode bias.

In the prior art device breakdown is reduced because of the type of device or transistor termination used in the diffusion region. The electric field lines tends to reduce their spacing in the prior art in the termination area leading to premature or lower avalanche breakdown voltages. To increase the avalanche breakdown voltage the trench 85 is used to terminate the diffusion regions 57 and 59 between active regions 80 to provide trench terminated junctions. With the trench walls formed perpendicular to the diffusion regions 57 and 59 the electric field lines are kept substantially straight and parallel to one another up to the trench wall thereby increasing the breakdown voltage. As previously discussed, the trench depth is important to assure higher reverse bias diode breakdown. Upon application of a reverse bias, a depletion region results and the trench depth should be selected to keep the depletion region from going beyond the depth of the trench and underneath the bottom to join the active region 80 that may be located next to it. In the case of desiring a 60 volt diode structure without reverse diode breakdown between devices, a trench depth of approximately four microns is required in the preferred embodiment.

Figure 7B:
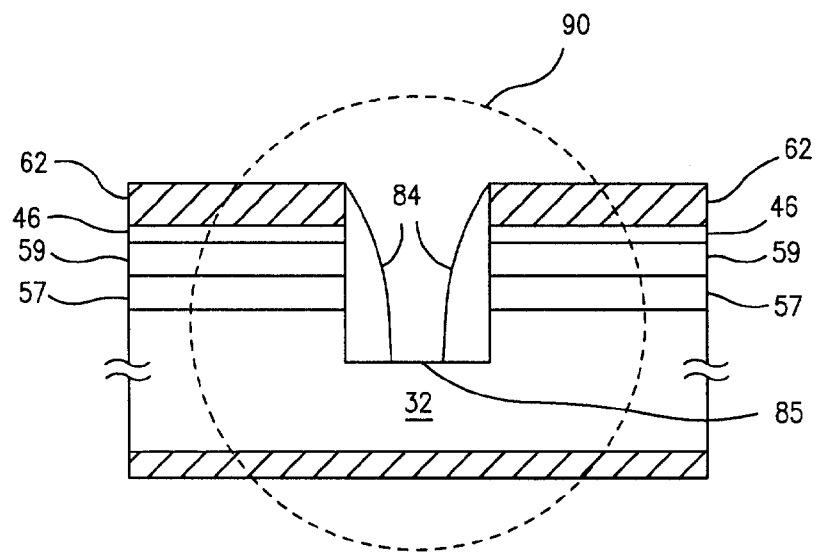

The next step in the process is to isotropically deposit a dielectric over the wafer so that the walls of the trenches are coated with three-tenths of a micron of a dielectric material such as oxide. The thickness of the dielectric material is varied depending upon the desired voltage capability of the diode structures. Next, a vertical etch is used to remove the dielectric and masking oxide from the horizontal surfaces of the diode devices to expose the metalization 62 and leaving the sidewall dielectric 84 in the trench as shown in FIG. 7B. With the termination trenches 85 completed, diodes may be formed from one or more of the active regions 80 and packaged together having separate terminals for individual connection such as in a chip package or they may be packaged having joined terminals to increase the current density of the diode device. In order to separate along the scribe lines 81 a saw is used to dice the desired number of active regions 80 for a packaged diode. The termination provided by the trench 85 illustrated in FIG. 7B is sufficient to cause the actual breakdown to occur beneath the pedestals at the edge of the p-type layer 57 in FIG. 3Q. This provides a very large area for the distribution of the breakdown energy over the thousands of pedestals in each diode active area 80 of a diode device.

Referring now to FIGS. 8A–8F, an alternate method of fabricating the pedestal diode of the present invention is illustrated. In this case the pedestals are formed by etching cylindrical pedestal openings 54' into pedestal material 34.

Figure 8A:
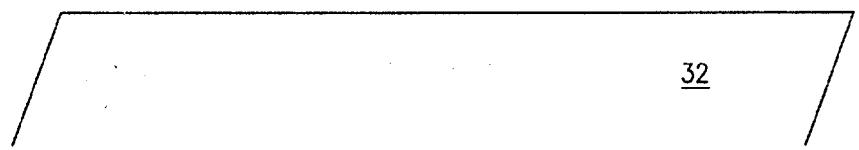
FIGS. 8A–8F are illustrations of an alternate method of fabricating the pedestal diode of the present invention.
Figure 8B:
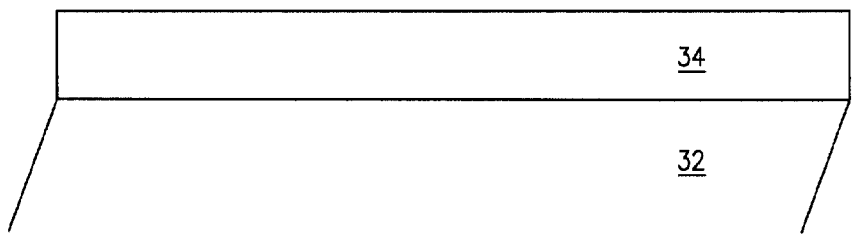
Figure 8C:
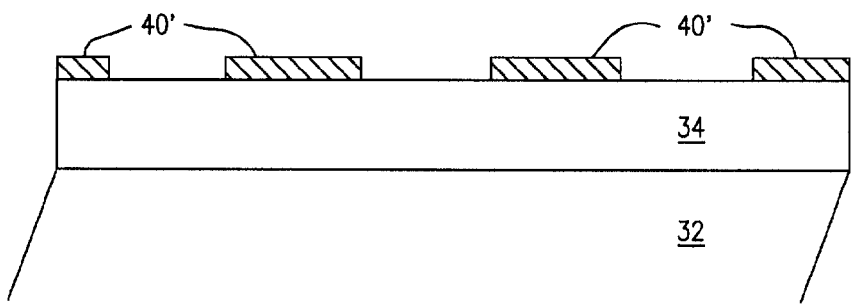
Figure 8D:
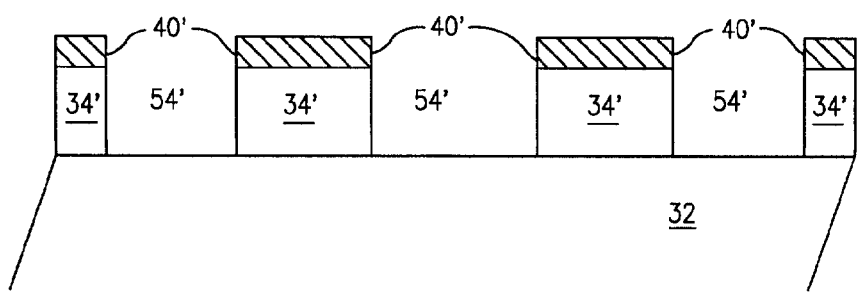
Figure 8E:
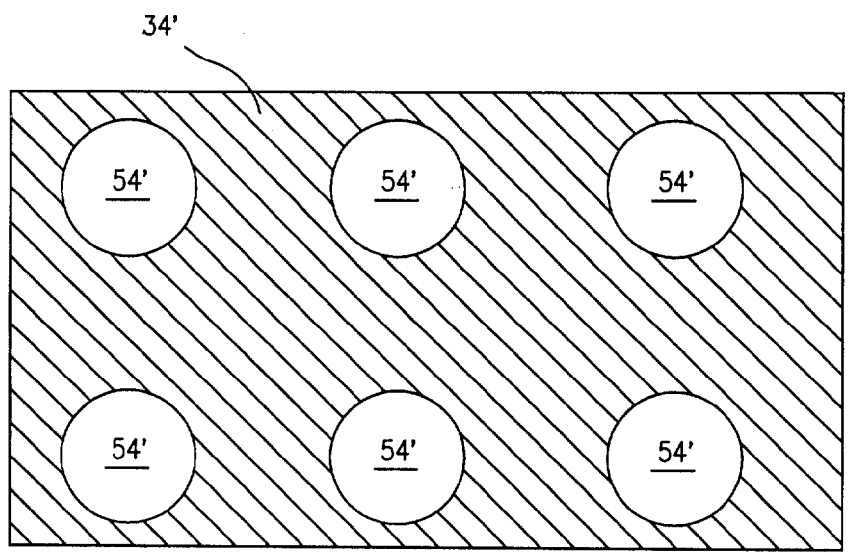
Figure 8F:
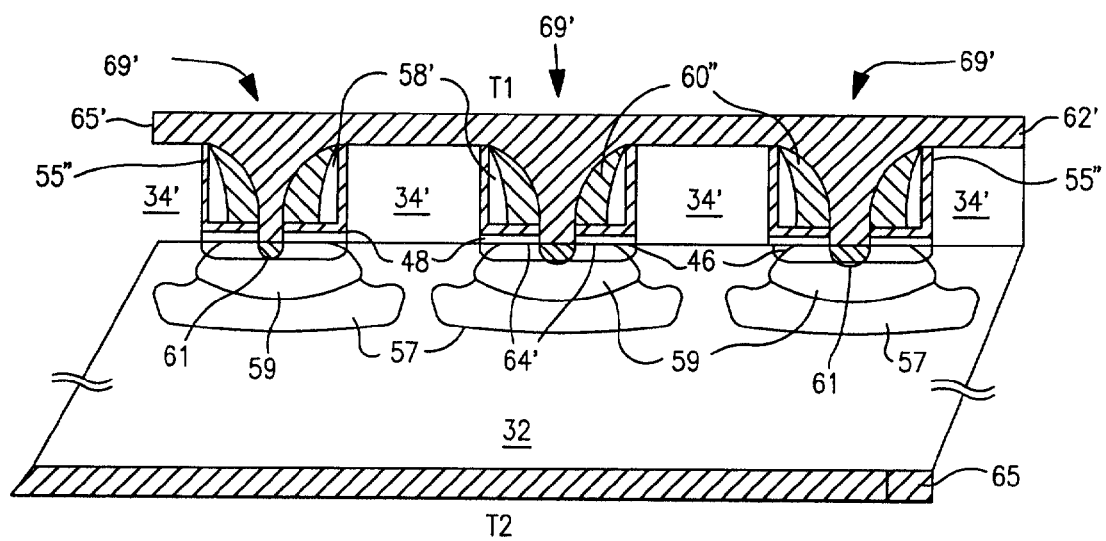

The process of fabrication begins as previously described with a substrate 32 in FIG. 8A. The pedestal material 34 is deposited onto the substrate as illustrated in FIG. 8B. A mask layer differing from previously described is used to define a photoresist pattern 40' which protects the underlying pedestal material 34 in selected areas. The next step is to etch away the pedestal material 34 in the cylindrical pedestal openings 54' as illustrated by FIG. 8D leaving the protected pedestal material 34' intact. Next the photoresist pattern 40' is removed. Referring now to FIG. 8E, the cylindrical pedestal openings 54' to the silicon substrate 32 are illustrated surrounded by the pedestal material 34'. The remaining processing steps are similar to those described above with reference to FIGS. 3D through 3Q which results in the pedestal diodes 69' formed around the pedestal material 34' and in the cylindrical pedestal openings 54' as illustrated in FIG. 8F. In this alternate embodiment, the gate region 64' of the gate connected diodes is formed within the cylindrical pedestal openings 54' around the diffusion 61 as opposed to around the cylindrical pedestals 54 previously described. The area and shape of the pedestal material 34' provides ample area of substrate 32 for the second diode terminal T2.

Gate layer 55" is formed to the cylindrical sides and a portion of the base of the cylindrical pedestal openings 54' around the diffusion 61. Spacer ring 58' is formed on the gate layer 55" inside the pedestal openings 54' in a cylindrical fashion coupling to the cylindrical sides and a portion of the base region of the gate layer 55". A polysilicon ring 60" is formed similar to and on the spacer ring 58' inside the pedestal 54'. Implant 57, backgate implant 59, and diffusion regions 61 are formed within the substrate 32. Interconnect layer 62' is deposited and makes electrical contact with the optional n-type channel implant 46 and diffusion regions 61 and the p+-type diffusion regions 57 & 59 and the gate layer 55". The interconnect layer 62' forms a first terminal, "T1", of the resulting pedestal diode 69', interconnecting the polysilicon gate regions 55" & 60" with the channel implant layer 46, diffusion region 61 and the diffusion regions 57 & 59. A second terminal, "T2", of the diode pedestal is formed by applying a conductive layer 65 to the backside of the substrate 32. An advantage to the pedestal diode 69' is that less area is used to form the cylindrical gate within the cylindrical pedestal openings 54' and thus a higher density of pedestal diodes 69' may be formed in a given wafer.

In the fabrication of the embodiments of the device just described, two masks are generally used. The first mask is used to pattern the photoresist 40 or 40' illustrated in FIG. 3C or FIG. 8C respectively in order to form the pedestal structures. The alignment of this mask is not critical. The second mask is used to define each diode active area 80, the scribe channels 81 and the trenches 85. The second mask also defines the interconnect layer between the first terminals of the diode. The alignment of the second mask is not critical with respect to the alignment of the first mask. Accordingly, there are no critical mask alignment requirements with respect to the fabrication techniques used herein. Therefore, relatively crude alignment may be used in comparison to that generally required for the processing of conventional diode devices.

In the foregoing description, the diode threshold, the equivalent of a field effect transistor threshold, is adjusted in the steps of channel implantation as illustrated in FIG. 3E and in forming the p-type back gate implant 59 illustrated in FIG. 3K. As an alternative, the threshold adjustment may be accomplished sooner in the process by an n-type implant before the pedestals 54 are formed.

It is evident that modification to the sequences of depositions, etches and implants can be made to produce the same final device but using a different process sequence. For example, by adding a sidewall deposition after the implant of the diffusion 61 in FIG. 3M, the diffusion implant for layer 57 may be accomplished near the end of the process sequence rather than near the beginning of the process as in FIG. 3I.

In certain instances in the foregoing description, certain alternate materials and methods were set forth. It is to be noted however, that the identification of specific alternative materials and processes is not to infer that still other materials and processes for those or other steps in the process of fabrication or in the resulting diode devices are excluded from use in the present invention. To the contrary, steps and materials other than those set out herein will be obvious to those skilled in the art. Thus while the present invention has been disclosed and described with respect to certain preferred embodiments, it will be understood to those skilled in the art that the present invention diodes and methods of fabricating the same may be varied without departing from the spirit and scope of the invention.

What is claimed is:

1. A cylindrical shaped diode having an anode and a cathode, the diode comprising:
   a semiconductor substrate of a first conductivity type having first and second surfaces;
   a pedestal material layer coupled to the semiconductor substrate shaped to form a pedestal having a cylindrical surface;
   a hollow oxide cylinder having top and bottom surfaces and first and second side cylindrical surfaces and a thickness there between, the first side cylindrical surface coupled to the cylindrical surface of the pedestal, the bottom surface of the hollow oxide cylinder coupled to the first surface of the semiconductor substrate;
   a first polysilicon gate layer coupled to the cylindrical surface of the pedestal above the top surface of the hollow oxide cylinder and further coupled to the top surface of the hollow oxide cylinder;
   the substrate having a first diffusion layer of a second conductivity type to form a channel underneath the bottom surface of the hollow oxide cylinder; and
   the substrate having a second diffusion layer of the first conductivity type within the first diffusion layer of the second conductivity type, the second diffusion layer being adjacent to the cylindrical channel.

2. The cylindrical shaped diode of claim 1, wherein, the pedestal material layer has a cylindrical open region to form the pedestal having the cylindrical surface.

3. The cylindrical shaped diode of claim 1, wherein, the pedestal is a solid cylinder of the pedestal layer material having a base coupled to the first surface of the semiconductor substrate.

4. The cylindrical shaped diode of claim 3, wherein, the solid cylinder of the pedestal layer material is a solid dielectric.

5. The cylindrical shaped diode of claim 4, wherein, the solid cylinder of the pedestal layer material is an oxide layer.

6. The cylindrical shaped diode of claim 3, wherein, the solid cylinder of the pedestal layer material is formed of multiple layers of material and a first layer is a solid cylindrical dielectric for coupling to the semiconductor substrate.

7. The cylindrical shaped diode of claim 6, wherein, the first layer of the solid cylinder of the pedestal layer material is an oxide layer.

8. The cylindrical shaped diode of claim 1, wherein, the first conductivity type is n-type and the second conductivity type is p-type and the semiconductor substrate forms the cathode region of the diode and the second diffusion layer forms the anode region of the diode and the cylindrical shaped diode includes a cylindrical N-channel diode connected field effect transistor with the first diffusion layer being a p-type body, the second diffusion layer being an n-type anode, and the semiconductor substrate being an n-type cathode.

9. The cylindrical shaped diode of claim 1, wherein, the first conductivity type is p-type and the second conductivity type is n-type and the semiconductor substrate forms the anode region of the diode and the second diffusion layer forms the cathode region of the diode and the cylindrical shaped diode includes a cylindrical P-channel diode connected field effect transistor with the first diffusion layer being an n-type body, the second diffusion layer being a p-type cathode, and the semiconductor substrate being a p-type anode.

10. The cylindrical shaped diode of claim 1, wherein, the polysilicon layer has the shape of a curved cylindrical surface with a cylindrical edge coupling to the hollow cylindrical oxide.

11. The cylindrical shaped diode of claim 1, wherein, the first diffusion layer of the second conductivity type form a cylindrical shaped channel underneath the hollow oxide cylinder.

12. The cylindrical shaped diode of claim 1, further comprising:
    a hollow cylindrical dielectric layer having a first cylindrical surface coupled to the polysilicon gate layer and a second cylindrical surface of varying radius from a top to a bottom of the dielectric layer so that the thickness of the hollow cylindrical dielectric layer varies from the top to the bottom.

13. The cylindrical shaped diode of claim 12, further comprising:
    a hollow cylindrical polysilicon layer having a first cylindrical surface coupled to the second cylindrical surface of the hollow cylindrical dielectric layer and a second cylindrical surface of varying radius from a top to a bottom of the polysilicon layer so that the thickness of the hollow cylindrical polysilicon layer varies from the top to the bottom.

14. The cylindrical shaped diode of claim 13, further comprising:
    a first conductive layer covering the second cylindrical surface of the hollow cylindrical polysilicon layer, the first conductive layer surrounding the first polysilicon gate layer and the pedestal, the first conductive layer electrically coupling to the first diffusion layer, the second diffusion layer and the first polysilicon gate layer to form a first terminal of the cylindrical shaped diode.

15. The cylindrical shaped diode of claim 14, further comprising:
    a second conductive layer coupled to the second surface of the semiconductor substrate, the second conductive layer to form a second terminal of the cylindrical shaped diode.

16. The cylindrical shaped diode of claim 1, further comprising:
a hollow cylindrical polysilicon layer having a first cylindrical surface coupled to the polysilicon gate layer and a second cylindrical surface of varying radius from a top to a bottom of the polysilicon layer so that the thickness of the hollow cylindrical polysilicon layer varies from the top to the bottom.

17. A diode device providing a one way electrical valve between an anode terminal and a cathode terminal, the diode device comprising:
one or more diode active regions having anodes coupled in parallel together for the anode terminal and cathodes coupled in parallel together for the cathode terminal, each diode active region including,
a plurality of diode connected cylindrical transistors each being formed from a cylindrical pedestal and having a cylindrical channel at the surface of the channel diffusion.

18. The diode device of claim 17, wherein each diode active region further includes
a dielectric coated silicon trench wall surrounding each diode active region and substantially perpendicular to planes of diffusion regions of the diode connected cylindrical transistors near the trench wall, the trench wall for causing electric field lines to be substantially parallel and terminate substantially perpendicular to the trench wall.

19. The diode device of claim 18, wherein,
the trench wall extends beyond the planes of diffusion regions of the diode connected cylindrical transistors to increase a reverse diode breakdown voltage.

20. The diode device of claim 18, wherein,
there are more than one diode active regions each spaced apart from one another and having a trench well spaced apart from another active regions trench wall.

21. The diode device of claim 20, wherein,
the trench walls are substantially spaced apart for ease of manufacture of the trench walls.

22. The diode device of claim 20, wherein,
the trench walls are minimally spaced apart to increase circuit density.

23. A diode having a first terminal and a second terminal, the diode comprising:
a cylindrical transistor having
a hollow cylindrical shaped channel with a gate,
a source region, and
a drain region;
the gate and the drain region of the cylindrical transistor coupled together and to the first terminal; and
the source region of the cylindrical transistor coupled to the second terminal.

24. The diode of claim 23, wherein,
the cylindrical transistor is an n-channel cylindrical transistor with the source region and the drain region being an n type semiconductor and the hollow cylindrical shaped channel of the cylindrical transistor being a p type semiconductor.

25. The diode of claim 24, wherein,
the first terminal is the anode of the diode, and
the second terminal is the cathode of the diode.

26. The diode of claim 23, wherein,
the cylindrical transistor is an p-channel cylindrical transistor with the source region and the drain region being a p type semiconductor and the hollow cylindrical shaped channel of the cylindrical transistor being an n type semiconductor.

27. The diode of claim 26, wherein,
the first terminal is the cathode of the diode, and
the second terminal is the anode of the diode.

28. The diode of claim 23, wherein,
the channel length of the cylindrical transistor is the thickness of the hollow cylinder shape of the hollow cylindrical shaped channel.

29. The diode of claim 23, wherein,
the width of the cylindrical transistor is a cylindrical width where the width is the circumference of the hollow cylinder shape of the hollow cylindrical shaped channel.

30. The diode of claim 23, wherein,
the gate has a ring shape to form the hollow cylindrical shaped channel.

31. The diode of claim 23, wherein,
the gate has a hollow bowl shape with a ring shape at its lip surrounding a pedestal to form the hollow cylindrical shaped channel.

32. A diode having a first terminal and a second terminal, the diode comprising:
a cylindrical transistor having
a hollow cylindrical shaped channel with a gate,
a source region, and
a drain region;
the gate and the source region of the cylindrical transistor coupled together and to the first terminal; and
the drain region of the cylindrical transistor coupled to the second terminal.

33. The diode of claim 32, wherein,
the cylindrical transistor is an n-channel cylindrical transistor with the source region and the drain region being an n type semiconductor and the hollow cylindrical shaped channel of the cylindrical transistor being a p type semiconductor.

34. The diode of claim 33, wherein,
the first terminal is the anode of the diode, and
the second terminal is the cathode of the diode.

35. The diode of claim 32, wherein,
the cylindrical transistor is an p-channel cylindrical transistor with the source region and the drain region being a p type semiconductor and the hollow cylindrical shaped channel of the cylindrical transistor being an n type semiconductor.

36. The diode of claim 35, wherein,
the first terminal is the cathode of the diode, and
the second terminal is the anode of the diode.

37. The diode of claim 32, wherein,
the channel length of the cylindrical transistor is the thickness of the hollow cylinder shape of the hollow cylindrical shaped channel.

38. The diode of claim 32, wherein,
the width of the cylindrical transistor is a cylindrical width where the width is the circumference of the hollow cylinder shape of the hollow cylindrical shaped channel.

39. The diode of claim 32, wherein,
the gate has a ring shape to form the hollow cylindrical shaped channel.

40. The diode of claim 32, wherein,
the gate has a hollow bowl shape with a ring shape at its lip surrounding a pedestal to form the hollow cylindrical shaped channel.

* * * * *